(12) United States Patent
Cho et al.

(10) Patent No.: US 6,970,393 B1
(45) Date of Patent: Nov. 29, 2005

(54) PULSE GENERATING CIRCUIT FOR SELF-REFRESH

(75) Inventors: Kwang Jun Cho, Seoul (KR); You Sung Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,201

(22) Filed: Jun. 30, 2004

(30) Foreign Application Priority Data

Jun. 28, 2004 (KR) ...................... 10-2004-0048988

(51) Int. Cl.$^7$ ................................................ G11C 7/00
(52) U.S. Cl. ...................... 365/222; 365/194; 365/211
(58) Field of Search ........................ 365/222, 211, 212, 365/189.07, 194

(56) References Cited

U.S. PATENT DOCUMENTS 4,716,551 A * 12/1987 Inagaki ........................ 365/222
6,483,764 B2 * 11/2002 Chen Hsu et al. .......... 365/222

* cited by examiner

Primary Examiner—Son T. Dinh
(74) Attorney, Agent, or Firm—Heller Ehrman LLP (57) ABSTRACT

A pulse generating circuit for self refresh including a voltage comparison unit having a plurality of selectable capacitor charged by a feedback voltage variably supplied through a first node depending on temperature change, for comparing the charge voltage with a reference voltage to output a signal corresponding to the comparison result, a delay circuit connected to the output of the voltage comparison unit, a control unit for receiving the output of the delay circuit, and a temperature sensor connected to the output of the control circuit and providing feedback signal to the voltage comparison unit.

4 Claims, 6 Drawing Sheets

PULSE GENERATING CIRCUIT FOR SELF-REFRESH

BACKGROUND OF THE INVENTION

1. Field of the Invention

The present invention generally relates to a pulse generating circuit for self-refresh, and more specifically, to a pulse generating circuit for self-refresh which regulates a pulse generation cycle by regulating the amount of charges by using a capacitor, thereby evaluating reliability.

2. Description of the Prior Art

In mobile or portable apparatus such as a cellar phone or a lap-top computer, it is important to embody low power function. Specifically, it is important to reduce the amount of current required in a self-refresh mode in order to embody the low power function in a DRAM.

In order to reduce the amount of current required in the self-refresh mode, operations are provided such as a Partial Array Self Refresh (hereinafter, referred to as "PASR"), a Temperature Compensated Self Refresh (hereinafter, referred to "TCSR"), and a Deep Power Down (hereinafter, referred to as "DPD") mode. Of these methods, a user can program the PASR and the TCSR with an Extended Mode Register Set (hereinafter, referred to as "EMRS").

Generally, data retention time of the DRAM is shortened as temperature more increases. As a result, a self-refresh cycle of the programmed TCSR is changed depending on temperature set by a user. Specifically, when the TCSR is used at low temperature, the self-refresh cycle is set to be long so that the amount of current can be reduced.

However, when the usage temperature of the DRAM is beyond the set range in the programmed TCSR, the reliability of the DRAM operation cannot be secured. As a result, the conventional EMRS-TCSR is required to be used restrictively.

In order to solve the above-described problems, an auto TCSR has been suggested. In the auto TCSR, temperature is not set by a user but is sensed in a chip, and a generation cycle of a refresh signal TEMPOSC (Temperature Oscillation) is automatically regulated depending on the sensed temperature.

Specifically, an auto TCSR having a temperature sensor in a memory chip is called on Die TCSR. The auto TCSR lengthen the refresh cycle at low temperature by using the amount of current differentiated in a diode depending on temperature.

Figure 1:
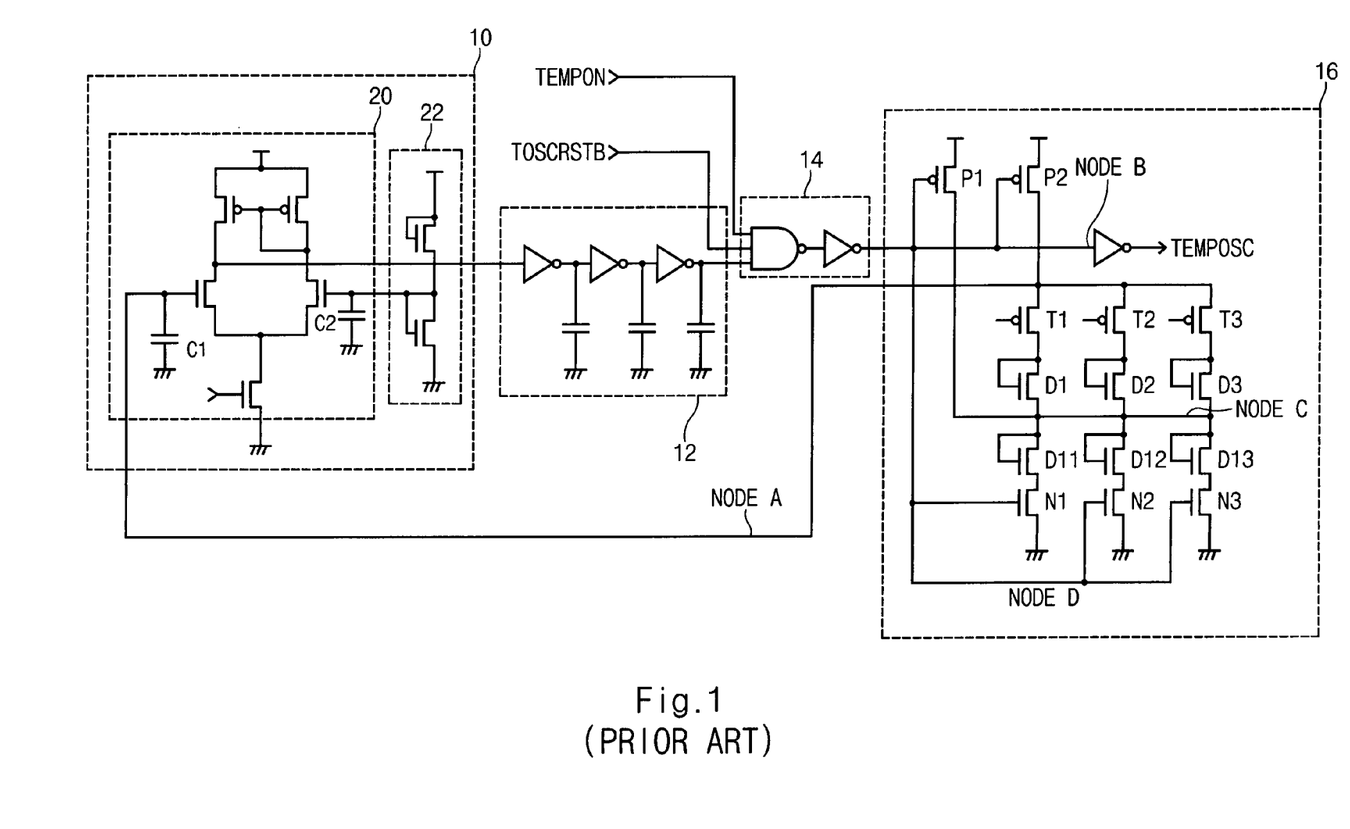
FIG. 1 is a circuit diagram of a conventional pulse generating circuit for self-refresh.

FIG. 1 is a diagram of a conventional pulse generating circuit for self-refresh with a diode.

The pulse generating circuit of FIG. 1 comprises a voltage comparator 10, a delay circuit 12, a control unit 14 and a temperature sensor 16. The voltage comparator 10 comprises a differential amplifier 20 and a reference voltage supply unit 22. The delay circuit 12 comprises a chain of an inverter and a capacitor which are connected in parallel. The control unit 14 is formed of combination of a NAND gate and an inverter.

The differential amplifier 20 compares a voltage, which is fed-back from the temperature sensor 16 and applied to a capacitor C1, with a voltage, which is supplied from the reference voltage supply unit 22 and applied to a capacitor C2, and then outputs the comparison result to the delay circuit 12. Here, the voltage applied to the capacitor C1 is charged as diode current is fed back through a node A.

The delay circuit 12 is used to secure charge and discharge time of the capacitor C1 in the differential amplifier 20.

The control unit 14 outputs a pulse where temperature is sensed in response to a control signal TEMPON or outputs a high level voltage.

The temperature sensor 16 is a circuit with a diode, and current flowing in a MOS diode has a temperature function. That is, when a gate source voltage Vgs is below about 3V, the amount of current is reduced as temperature becomes lower.

In other words, charges in the capacitor of the delay circuit 12 are discharged through the diode of the temperature sensor 16. Here, when the charges are discharged over at a predetermined level, a pulse is generated by the voltage comparator 10. Here, sensing diodes D1, D2 and D3 are connected in parallel for setting temperature. The sensing operation is performed depending on temperature setting by selectively operating switching transistors T1, T2 and T3. The current determined by the sensing diodes D1, D2 and D3 is transmitted to the voltage comparator 10 through the node A.

The above-described pulse generating circuit generates a pulse by charge through the capacitor and discharge through a diode. The generation cycle of the pulse can be regulated corresponding to the temperature depending on selection of the diode.

However, the amount of current flowing in the diode is changed sensitively depending on temperature. Therefore, the above-described pulse generating circuit for self-refresh which senses temperature with a diode has large cycle distribution even in the same lot or the same wafer.

Figure 2:
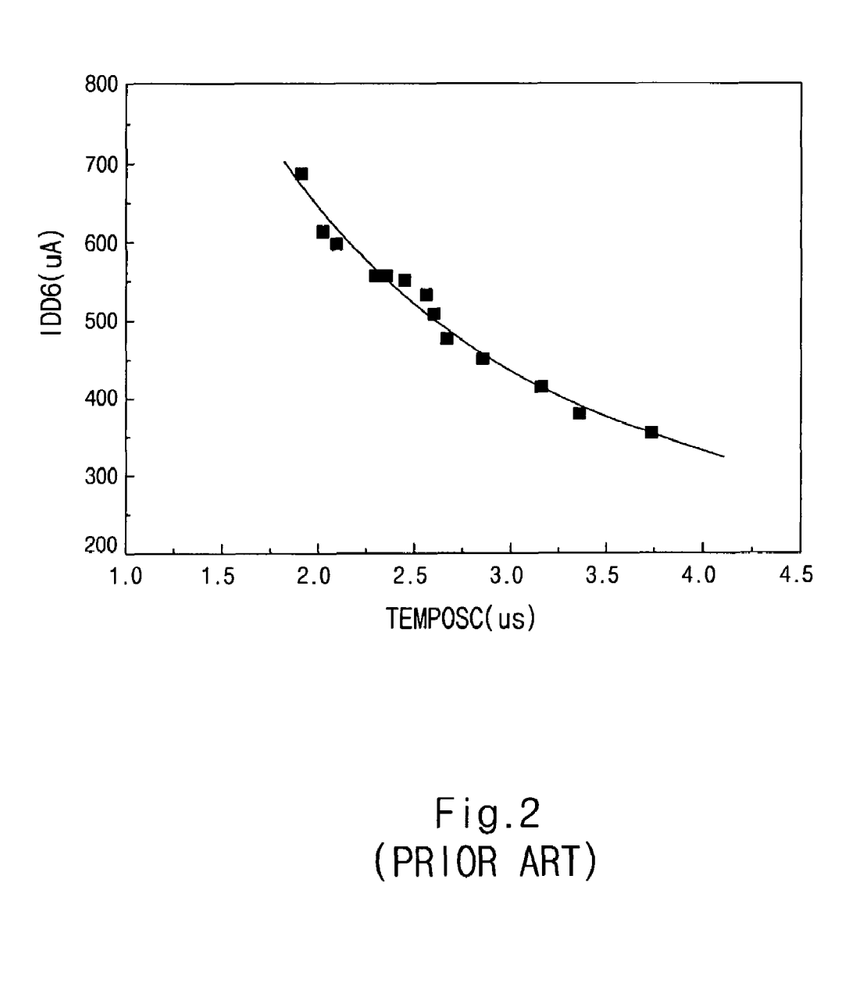
FIG. 2 is a graph illustrating relation of a self-refresh cycle and self-refresh current measured on the same wafer.

When the pulse generating circuit actually performs an operation to compensate temperature as a diode, the relation between the self-refresh cycle (TEMPOSC cycle) and refresh current IDD6 which are measured in the same wafer can be measured as shown in FIG. 2. That is, the self-refresh cycle has a difference of more than two times depending on the refresh current in the same wafer.

As shown in FIG. 2, a cycle of the refresh signal TEMPOSC is required to be adjusted to regulate the refresh current IDD6 having the large distribution below at a predetermined level.

A conventional refresh circuit regulates the cycle of the refresh signal TEMPOSC in comparison with a basic cycle. As a result, refresh fail can increase by the operation characteristic of the diode sensitive to temperature.

For example, if the refresh signal TEMPOSC of the Die having a basic cycle as $\lambda(\mu s)$ at 85° C., the refresh time by the refresh signal TEMPOSC becomes 32 ms in case of 4 division and 4 k cycle refresh. Here, if the refresh time is set to be 64 ms in order to reduce the current IDD6, the division is 8 or the cycle is 4.0 $\mu s$. However, the above-described case may cause the following problem.

When temperature which is 8 times of the basic cycle (normal self-refresh) is T, the refresh signal TEMPOSC having 4 division around the temperature T has a refresh time of $(2+\alpha)*4*4$ k. However, if the refresh signal is trimmed at 8 division, the refresh time is $(2+\alpha)*8*4$ k so that it increases two times in comparison with 4 division.

When the cycle of the refresh signal TEMPOSC is 2.0 $\mu s$ around the temperature T, the cycle of the refresh signal TEMPOSC is $2+\alpha=8*\lambda$. However, if the cycle increases two times to 4.0 $\mu s$, the cycle of the refresh signal TEMPOSC is $2*(2+\alpha)$ around the temperature T. As a result, the cycle is 8 times larger than the basic cycle so that the refresh signal TEMPOSC is reset at a temperature higher than the temperature T.

As described above, in the conventional pulse generating circuit to compensate temperature with a diode, self-refresh current is changed sensitively to temperature, and the difference of the cycle distribution becomes larger depending on object even in the same lot or the same wafer.

Therefore, it is difficult to test reliability of the pulse operation for self-refresh under a predetermined condition.

SUMMARY OF THE INVENTION

It is an object of the present invention to stably control a pulse cycle by regulating the amount of charges with capacitors, and also to perform a test by increasing a predetermined cycle for self-refresh margin check at high temperature.

It is another object of the present invention to control a pulse cycle and a margin of a refresh signal by using characteristics of diodes and capacitors.

In an embodiment, a pulse generating circuit for self-refresh comprises a voltage comparison unit, a delay circuit, a control unit and a temperature sensor. The voltage comparison unit, which comprises a plurality of selectable capacitor charged by a feedback voltage variably supplied through a first node depending on temperature change, compares the charged voltage with a reference voltage to output a signal corresponding to the comparison result. The delay circuit inverts and delays an output signal from the voltage comparison unit. The control unit switches an output signal from the delay circuit in response to an external control signal to control the output operation of a refresh signal for compensating temperature. The temperature sensor provides the feedback voltage dependent on temperature through the first node, and charges or discharges the capacitor of the voltage comparison unit through the first node in response to an output signal from the control unit so that a margin of the refresh signal is regulated depending on the number of the selected capacitors. As a result, a margin of the refresh signal is regulated depending on the number of selected capacitors.

Preferably, the voltage comparison unit comprises a temperature compensating unit comprising a plurality of paired transistors and capacitors which are connected in parallel to the first node, a reference voltage supply unit for supplying a reference voltage, and a differential amplifier for comparing a voltage applied from the first node with that of the reference voltage supply unit to output a signal corresponding to the comparison result.

Preferably, each of the capacitors in the temperature compensating unit has capacity ranging from 1 to 100% of that of a basic capacitor which is settable in the differential amplifier.

The temperature sensor comprises a plurality of diodes and switching transistors for selection of the diodes, and regulates the amount of current supplied through the first node to adjust the cycle of the refresh signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

Figure 3:
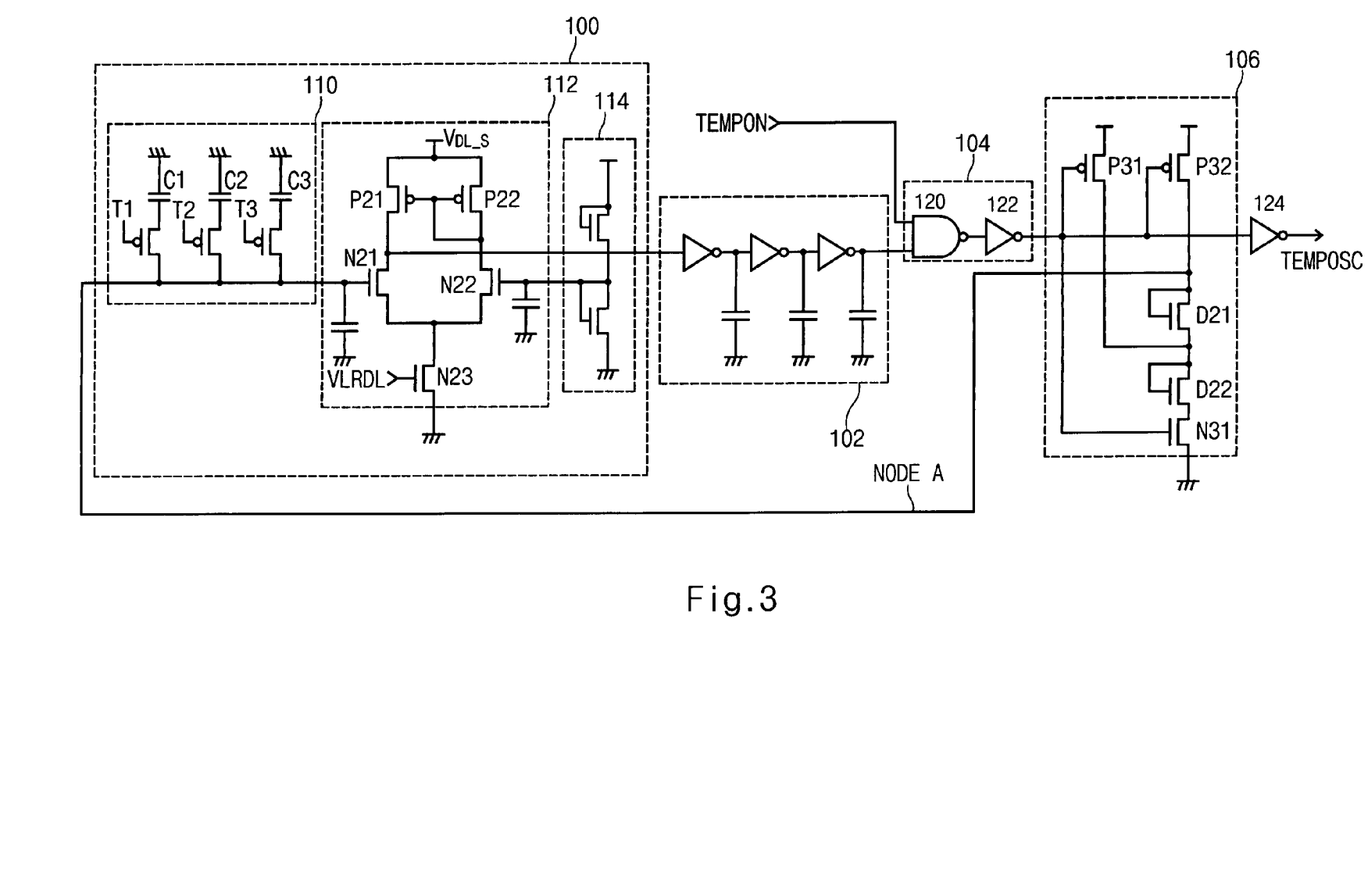
FIG. 3 is a circuit diagram of a pulse generating circuit for self-refresh according to an embodiment of the present invention.

In an embodiment, a pulse generating circuit for self-refresh comprises a voltage comparison unit 100, a delay circuit 102, a control unit 104 and a temperature sensor 106 as shown in FIG. 3.

The voltage comparison unit 100 comprises a temperature compensating unit 110, a differential amplifier 112 and a reference voltage supply unit 114. The temperature compensating unit 110 includes a pair of a transistor T1 and a capacitor C1, a pair of a transistor T2 and a capacitor C2, and a pair of a transistor T3 and a capacitor C3, which are connected serially with each other and connected in parallel to a node A. The differential amplifier 112 compares voltages applied from the reference voltage supply unit 114 and the node A, and outputs the comparison result to the delay circuit 102. The reference voltage supply unit 114 supplies a reference voltage to the differential amplifier 112.

The differential amplifier 112 comprises PMOS transistors P21, P22, and NMOS transistors N21, N22 and N23. The PMOS transistors P21 and P22 have a common gate, the PMOS transistor 21 is connected serially to the NMOS transistor N21, and the PMOS transistor P22 is connected serially to the NMOS transistor N22. The NMOS transistor N23 having a gate to receive a control signal VLRLD is connected in parallel to the NMOS transistors N21 and N22. The gate of the PMOS transistor P22 is connected to a drain. Also, a gate of the NMOS transistor N21 is connected to the node A coupled in parallel with a basic transistor. A gate of the NMOS transistor N22 is connected to the reference voltage supply unit 114, and has a transistor connected in parallel.

Here, a capacitor included in the temperature compensating unit 110 is configured to be connected in parallel to have various capacitance ranging from 1 to 100% to capacitance of the basic capacitor of the differential amplifier 112.

The delay circuit 102 comprises a plurality of inverters connected in parallel to a plurality of capacitors.

The delay circuit 102 is used to secure charge and discharge time of the capacitor included in the differential amplifier 112. The control unit 104 comprises a NAND gate 120 and an inverter 122. The NAND gate 120 performs a NAND operation on an output signal from the delay circuit 102 and a control signal TEMPON, and the inverter 122 inverts an output signal from the NAND gate 120. The control signal TEMPON is applied to control the output operation of a pulse having a sensed temperature or a high level signal. That is, the temperature compensating operation is determined in response to the control signal TEMPON.

The temperature sensor 106 comprises PMOS transistors P31 and P32. A gate of the PMOS transistors P31 and P32 is connected in common to an output node of the control unit 104. To the PMOS transistor P32 is connected serially diodes D21, D22 and a NMOS transistor N31. A gate of the NMOS transistor N31 is connected to an output node of the control unit 104, and a drain of the PMOS transistor P31 is connected between the diodes D21 and D22. The node A is connected between the PMOS transistor P32 and the diode D21. An output signal form the control unit 104 is connected in common to an output signal from the temperature sensor 106, and the output signal from the temperature sensor 106 is inverted in the inverter 124 and outputted as a refresh signal TEMPOSC.

As described above, when the control signal TEMPON is turned on in an embodiment of the present invention, a cycle of the refresh signal TEMPOSC is regulated depending on temperature by selection of the capacitors C1, C2, C3 of the temperature compensating unit 110 in the voltage comparison unit 100.

In other words, if the control signal TEMPON is 'low', the output signal from the control unit 104 is maintained at a low level and the node A has a voltage at a high level. As a result, the capacitors of the temperature compensating unit 110 and the differential amplifier 112 which are connected to the node A are charged.

On the other hand, if the control signal TEMPON is 'high', the PMOS transistor P32 of the temperature sensor 106 is turned off so that the capacitors of the temperature compensating unit 110 and the differential amplifier 112 are discharged. Here, the voltage drop gradient of the node A is determined depending on capacity of the NMOS diode D21, and the voltage drop waveform of the node A is shifted depending on the number of capacitors selected in the temperature compensating unit 110.

Figure 4:
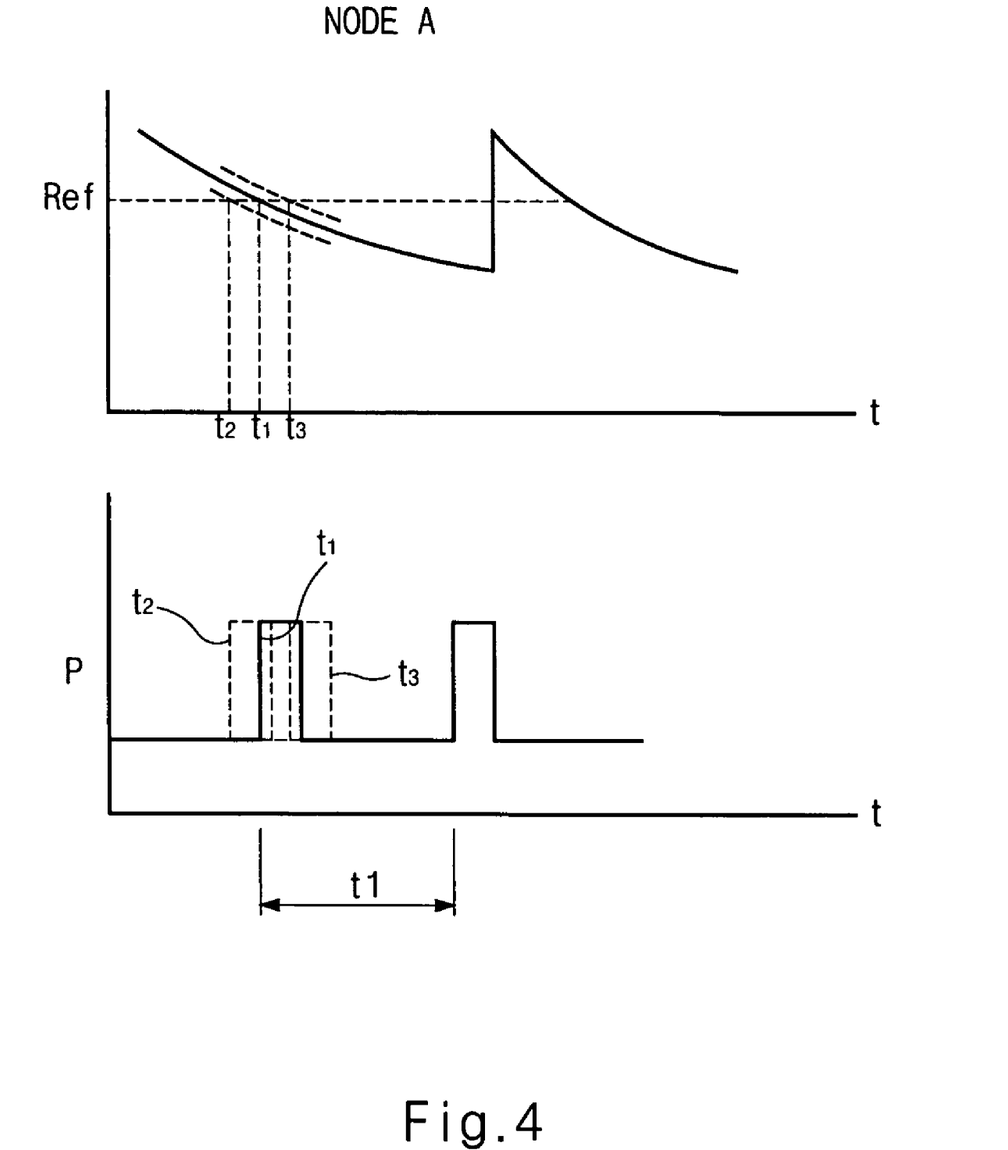
FIG. 4 is a waveform diagram illustrating pulse variation according to an embodiment of the present invention.

As shown in FIG. 4, in the voltage drop waveform of the node A, a timing to reach a reference voltage REF is changed into t1, t2, t3 depending on the number of selected capacitors. As a comparison result of the node A and the reference voltage, a pulse of the refresh signal TEMPOSC outputted through the delay unit 102 and the control unit 104 is varied.

In other words, the timing is changed from t1 to t2 by reducing the number of capacitors selected at high temperature so that the cycle of the pulse is shortened. At low temperature, the timing is changed from t1 to t3 by increasing the number of selected capacitors so that the cycle of the pulse is lengthened.

The capacity of the capacitors is not largely changed depending on temperature. Therefore, in the pulse generating circuit to compensate temperature according to an embodiment of the present invention, the change of the refresh signal is insensitive to temperature change.

Accordingly, in an embodiment, it is possible to test reliability of the pulse operation for self-refresh under a predetermined condition without a large difference in cycle distribution depending on object even in the same lot or the same wafer by regulating the capacity of capacitors.

In the above-described embodiment of FIG. 3, the generation cycle of the refresh signal TEMPOSC can be adjusted regardless of the amount of current flowing in a diode at the same temperature. Specifically, it is possible to test the reliability by increasing a predetermined cycle to check a margin of self-refresh at high temperature.

Furthermore, the temperature sensor 106 of FIG. 3 can comprise a plurality of diodes in order to regulate a refresh signal to have a desired cycle in another embodiment. In this embodiment, the cycle of the refresh signal is adjusted by regulating the amount of current flowing in the node A depending on the number of diodes selected as shown in FIG. 1.

Figure 5:
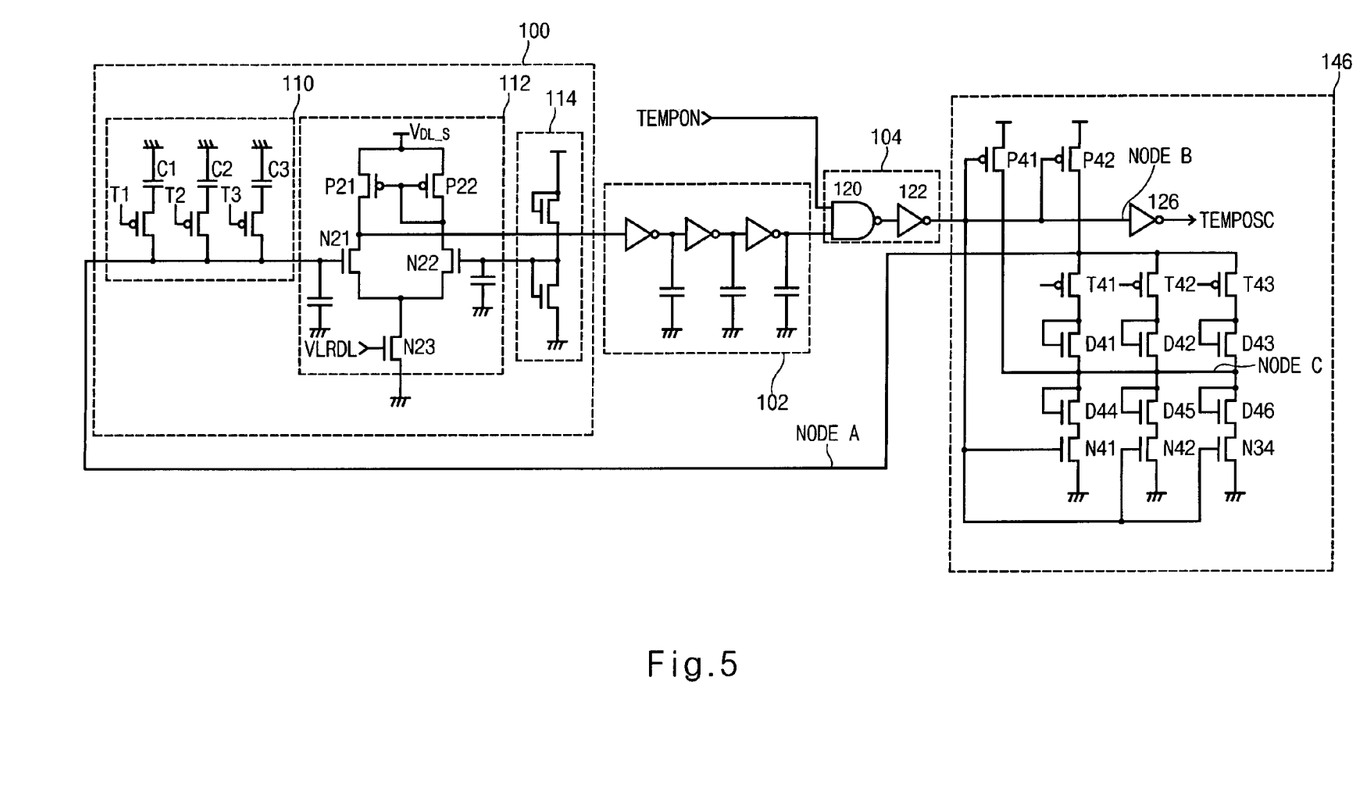
FIG. 5 is a circuit diagram of a pulse generating circuit for self-refresh according to another embodiment of the present invention.

Referring to FIG. 5, a pulse generating circuit for self-refresh comprises a voltage comparison unit 100, a delay unit 102, a control unit 104 and a temperature sensor 146.

Since the voltage comparison unit 100, the delay circuit 102 and the control unit 104 are configured with the same elements as those of FIG. 3, the detailed explanation on the structure and the operation is omitted.

In the temperature sensor 146, an output signal from the control unit 104 is inverted in an inverter 126, and outputted as a refresh signal TEMPOSC. Here, the connection between the control unit 104 and the inverter 126 refers to a node B. The temperature sensor 146 comprises PMOS transistors P41 and P42, switching transistors T41, T42 and T43, NMOS diodes D41, D42, D43, D44, D45, D46, and NMOS transistors N41, N42 and N43.

Here, the switching transistor T41, the NMOS diodes D41, D44 and the NMOS transistor N$1 are connected serially. The switching transistor T42, the NMOS diodes D42 and D45, and the NMOS transistor N42 are connected serially. The switching transistor T43, the NMOS diodes D43 and D46 and the NMOS transistor N43 are connected serially.

Each of the switching transistors T41, T42 and T43 are connected in parallel to the node A with the PMOS transistors P41 and P42. A drain of the PMOS transistor P41 forms a node C which is connected between the NMOS diodes D41 and D44, between the NMOS diodes D42 and D45 and between the NMOS diodes D43 and D46.

Gates of the PMOS transistors P41 and P42 and the NMOS transistors N41, N42 and N43 are connected in common to the node B.

As described above, in the embodiment of FIG. 5, margin security by capacitors can be easily regulated, and the cycle of the refresh cycle can also be adjusted with diodes.

If the switching transistors T42 and T43 are turned off and the diodes D41 and D44 of FIG. 3 are applied in the embodiment of FIG. 5, the same configuration and the same structure as those of FIG. 3 can be obtained in the embodiment of FIG. 5.

Additionally, if the switching transistors T41, T42 and T43 are switched to select the diodes D41, D42 and D43, current supplied to the node A is changed so that the voltage drop gradient is changed. As a result, the cycle can be easily regulated with a large width.

That is, if the control signal TEMPON is 'low', the output signal from the control unit 104 is kept 'low' and the node A has a 'high' voltage. As a result, capacitors of the temperature compensating unit 110 and the differential amplifier 112 which are connected to the node A are charged.

On the other hand, if the control signal TEMPON is 'high', the PMOS transistor P32 of the temperature sensor 106 is turned off so that the capacitors of the temperature compensating unit 110 and the differential amplifier 112 are discharged. Here, the voltage drop gradient of the node A is determined depending on capacity of the NMOS diode D21, and the voltage drop waveform of the node A is shifted depending on the number of capacitors selected in the temperature compensating unit 110.

Figure 6:
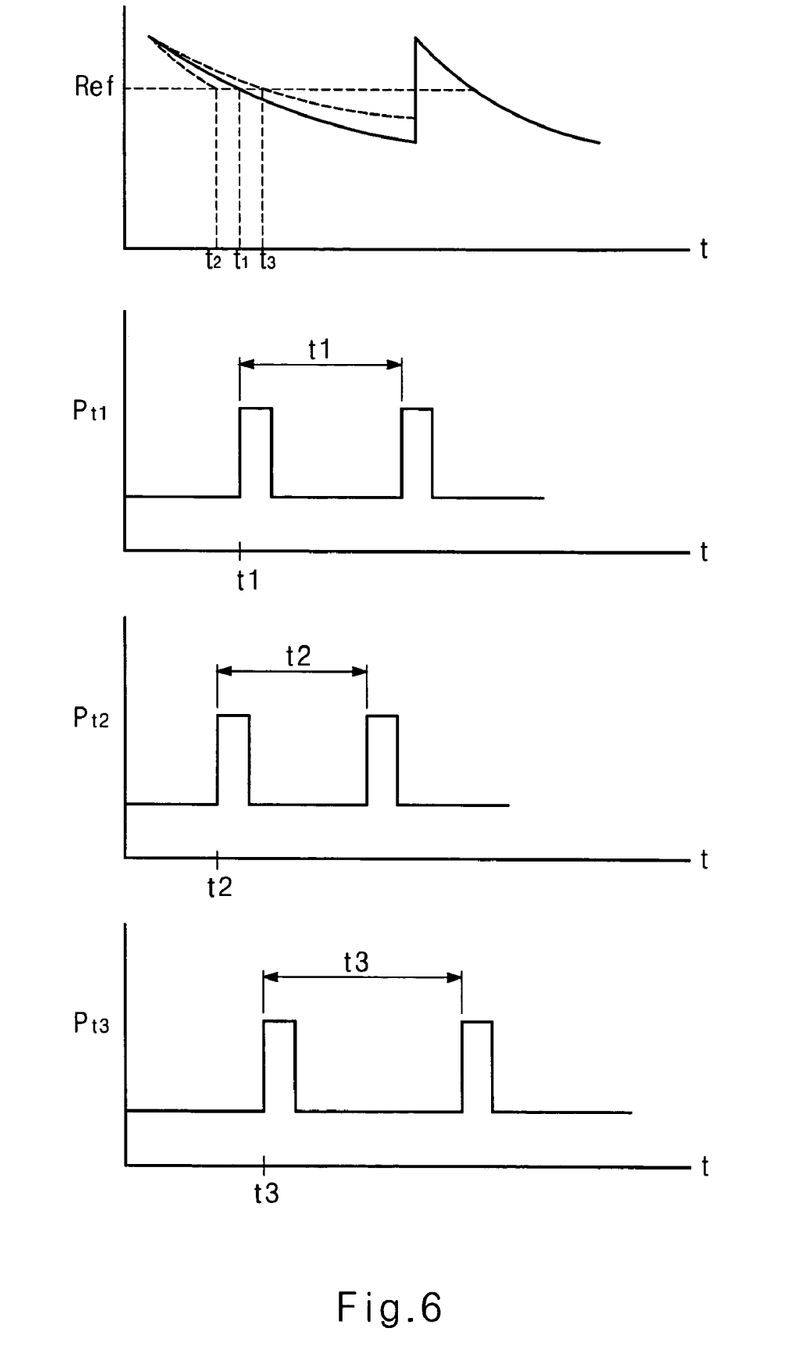
FIG. 6 is a waveform diagram illustrating pulse variation according to another embodiment of the present invention.

When the number of capacitors is determined, in the voltage drop waveform of the node A, a timing to reach the reference voltage REF is changed into t1, t2 and t3 depending on the number of selected diodes. As a comparison result of the node A and the reference voltage, the pulse of the refresh signal TEMPOSC outputted through the delay circuit 102 and the control unit 104 is varied.

In other words, the timing is changed from t1 to t2 by increasing the number of diodes selected at high temperature so that the amount of current supplied to the node A decreases and the cycle of the pulse is shortened. In case of low temperature, the timing is changed from t1 to t3 by reducing the number of selected diodes so that the amount of current increases and the cycle of the pulse is lengthened.

Accordingly, it is possible to control the refresh signal TEMPOSC with characteristics of capacitors and diodes, and also to test reliability of the pulse operation for self-refresh depending on a desired condition.

As discussed earlier, in a temperature compensating self-refresh circuit, a pulse cycle is stably controlled by regulating the amount of charges with capacitors, and it is possible to perform a test by increasing a predetermined cycle to check a self-refresh margin at high temperature.

Additionally, it is possible to test reliability of the pulse operation for self-refresh under a desired condition by controlling a pulse cycle and a margin of a refresh signal with characteristics of diodes and capacitors.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A pulse generating circuit for self-refresh, comprising:
a voltage comparison unit, comprising a plurality of selectable capacitor charged by a feedback voltage variably supplied through a first node depending on temperature change, for comparing the charged voltage with a reference voltage to output a signal corresponding to the comparison result;
a delay means for inverting and delaying an output signal from the voltage comparison unit;
a control unit for switching an output signal from the delay means in response to an external control signal to control the output operation of a refresh signal for compensating temperature; and
a temperature sensor for providing the feedback voltage dependent on temperature through the first node, and charging or discharging the capacitor of the voltage comparison unit through the first node in response to an output signal from the control unit;
whereby a margin of the refresh signal is regulated depending on the number of the selected capacitors.

2. The circuit according to claim 1, wherein the voltage comparison unit comprises:
a temperature compensating unit comprising a plurality of paired transistors and capacitors which are connected in parallel to the first node;
a reference voltage supply unit for supplying a reference voltage; and
a differential amplifier for comparing a voltage applied from the first node with that of the reference voltage supply unit to output a signal corresponding to the comparison result.

3. The circuit according to claim 2, wherein each of the capacitors in the temperature compensating unit has capacity ranging from 1 to 100% of that of a basic capacitor which is settable in the differential amplifier.

4. The circuit according to claim 3, wherein the temperature sensor comprises a plurality of diodes and switching transistors for selection of the diodes, and regulates the amount of current supplied through the first node to adjust the cycle of the refresh signal.

* * * * *